United States Patent [19]
Miwa

[11] Patent Number: 5,629,219
[45] Date of Patent: May 13, 1997

[54] METHOD FOR MAKING A COMPLEMENTARY BIPOLAR TRANSISTOR

[75] Inventor: Hiroyuki Miwa, Kanagawa, Japan

[73] Assignee: Sony Corporation, Tokyo, Japan

[21] Appl. No.: 520,704

[22] Filed: Aug. 29, 1995

[30] Foreign Application Priority Data

Aug. 29, 1994 [JP] Japan ................... 6-227248

[51] Int. Cl.⁶ .................................. H01L 21/265
[52] U.S. Cl. .......................... 438/322; 438/368
[58] Field of Search ........................ 437/31, 59, 162, 437/189, 191, 193, 34

[56] References Cited

U.S. PATENT DOCUMENTS

5,244,835  9/1993  Hachiya ........................... 437/162

*Primary Examiner*—Tuan H. Nguyen
*Attorney, Agent, or Firm*—Hill, Steadman & Simpson

[57] ABSTRACT

A hole in the site for the emitter layer of the npn transistor of a complementary bipolar transistor is made in a step independent from a step of making a hole in the site for the emitter layer of the pnp transistor, and an $n^+$-type polycrystalline Si film doped with an n-type impurity upon being made is used to make the emitter electrode of the npn transistor. Independently from this step, a $p^+$-type polycrystalline Si film doped with a p-type impurity upon being made is used to make the emitter electrode of the pnp transistor. The n-type impurity diffusing from the emitter electrode makes an $n^+$-type emitter layer of the npn transistor, whereas the p-type impurity diffusing from the emitter electrode makes a $p^+$-type emitter layer of the pnp transistor. Thus the method can produce complementary bipolar transistors with a higher performance, and is suitable for combination with a process for fabricating sub-half-micron bipolar CMOSs.

5 Claims, 13 Drawing Sheets

P-DOPED POLYSILICON
SiO₂

METHOD FOR MAKING A COMPLEMENTARY BIPOLAR TRANSISTOR

BACKGROUND OF THE INVENTION

1. Field of the Invention

This invention relates to a method for fabricating semiconductor devices and more particularly to a method suitable for fabricating complementary bipolar transistor.

2. Description of the Related Art

Recently, attention is centered to complementary bipolar transistors having both an npn transistor and a pnp transistor in combination and usable as devices enabling realization of LSIS operative at a very high speed with a low power consumption.

FIGS. 1A to 1E show a conventional method for fabricating a complementary bipolar transistor.

Figure 1A:
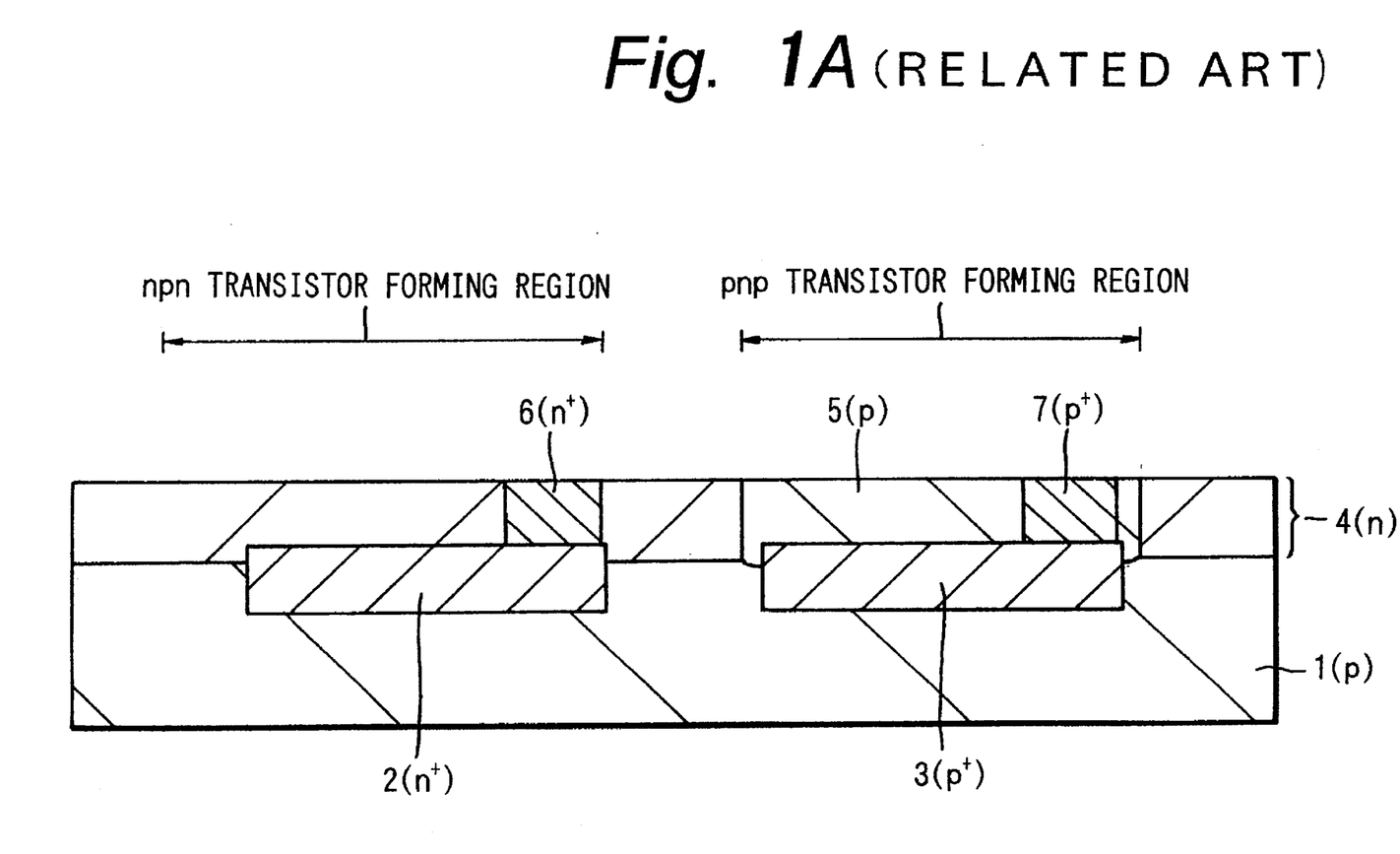
FIGS. 1A through 1E show a method according to a related art for manufacturing a complementary bipolar transistor, in which holes for emitters of its npn transistor and pnp transistor are formed simultaneously.

In the conventional process for fabricating a complementary bipolar transistor, as shown in FIG. 1A, after an $n^+$-type buried layer 2 and a $p^+$-type buried layer 3 are first formed in a p-type Si substrate 1, an n-type Si epitaxial layer 4 is stacked on the p-type Si substrate 1. A p-type impurity is next ion-implanted into a selective portion of the n-type Si epitaxial layer 4 corresponding to the site for a pnp transistor to make a p-well 5. Then, an n-type impurity is ion-implanted into a selective portion of the n-type Si epitaxial layer 4 corresponding to the site for an npn transistor to make an $n^+$-type layer 6, and a p-type impurity is selectively ion-implanted into the p-well 5 in the site for the pnp transistor to make a $p^+$-type layer 7.

Figure 1B:
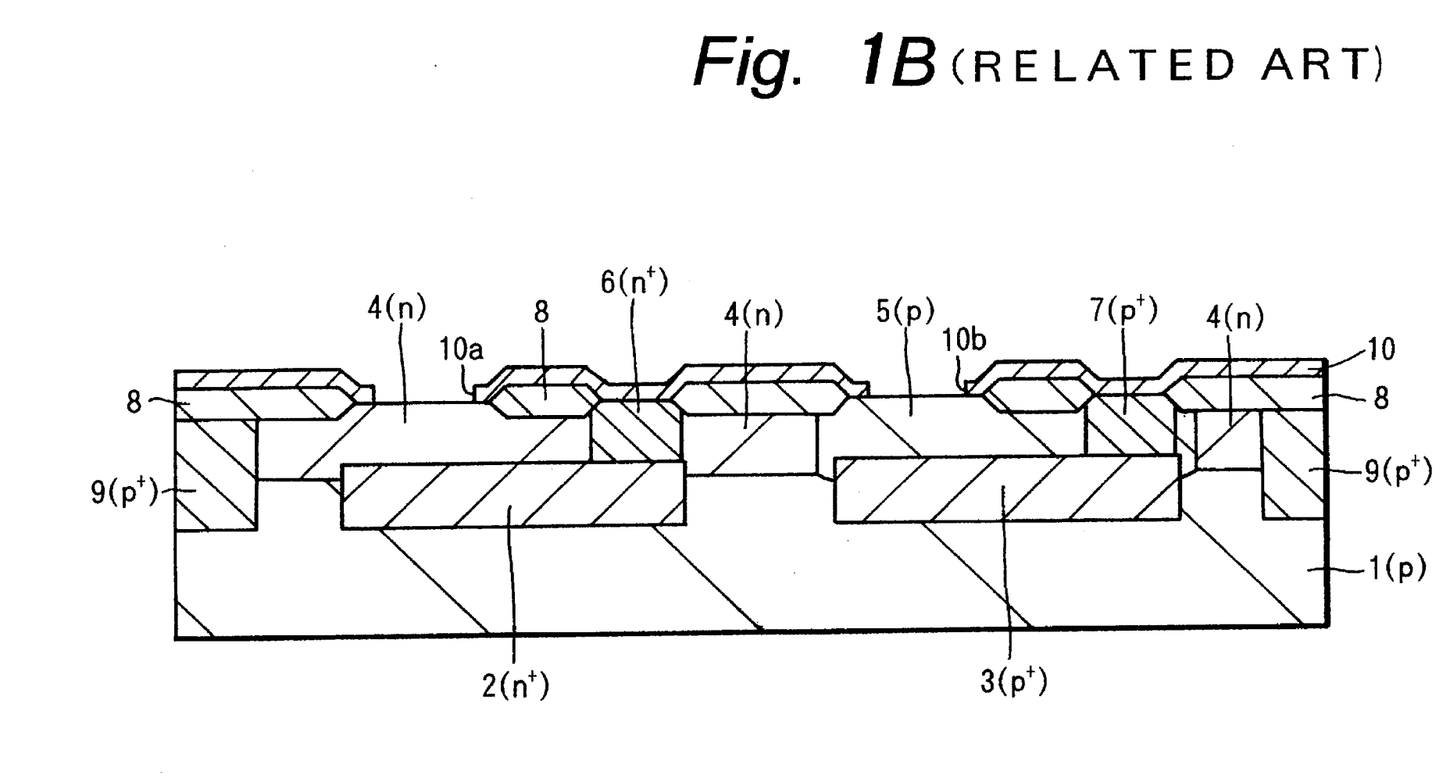

After that, as shown in FIG. 1B, a field insulation film 8 comprising a $SiO_2$ film is selectively stacked on the surface of the n-type Si epitaxial layer 4 for isolation of devices, and a device-isolating $p^+$-type layer 9 is formed in a portion of the n-type Si epitaxial layer 4 just under the field insulation film 8. The entire structure is next covered by an insulation film 10 such as $SiO_2$ film, and selective portions of the insulation film 10 corresponding to the sites for the npn transistor and the pnp transistor are removed by etching to form holes 10a and 10b.

Figure 1C:
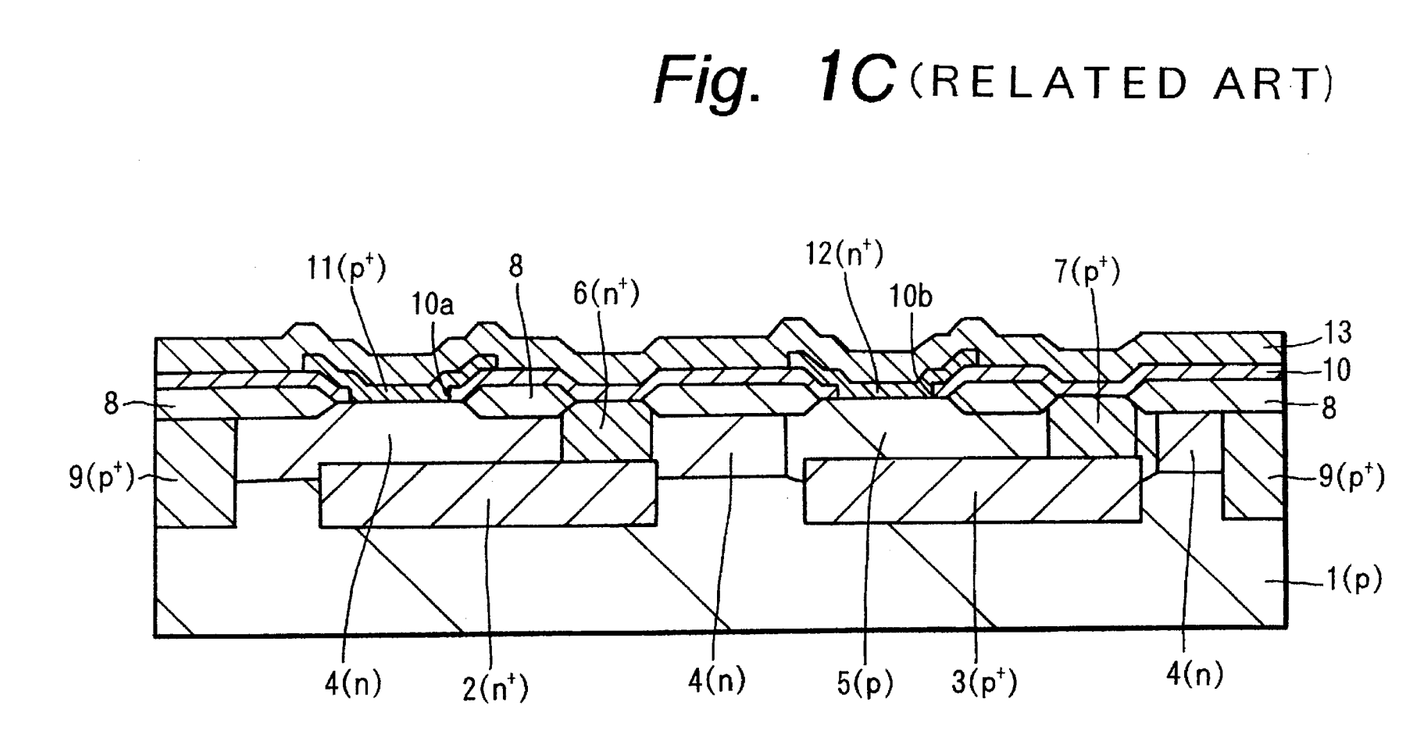

After a polycrystalline Si film is made on the entire surface, a p-type impurity is introduced into a selective portion of the polycrystalline Si film including the site for the base electrode of the npn transistor, and an n-type impurity is introduced into a selective portion of the polycrystalline Si film including the site for the base electrode of the pnp transistor, by ion implantation, for example. The polycrystalline Si film is then processed by etching to form a $p^+$-type polycrystalline Si film 11 of a shape corresponding to the base electrode of the npn transistor and an $n^+$-type polycrystalline Si film 12 of a shape corresponding to the base electrode of the pnp transistor as shown in FIG. 1C. After that, an insulation film 13 such as $SiO_2$. film, is formed on the entire surface.

Figure 1D:
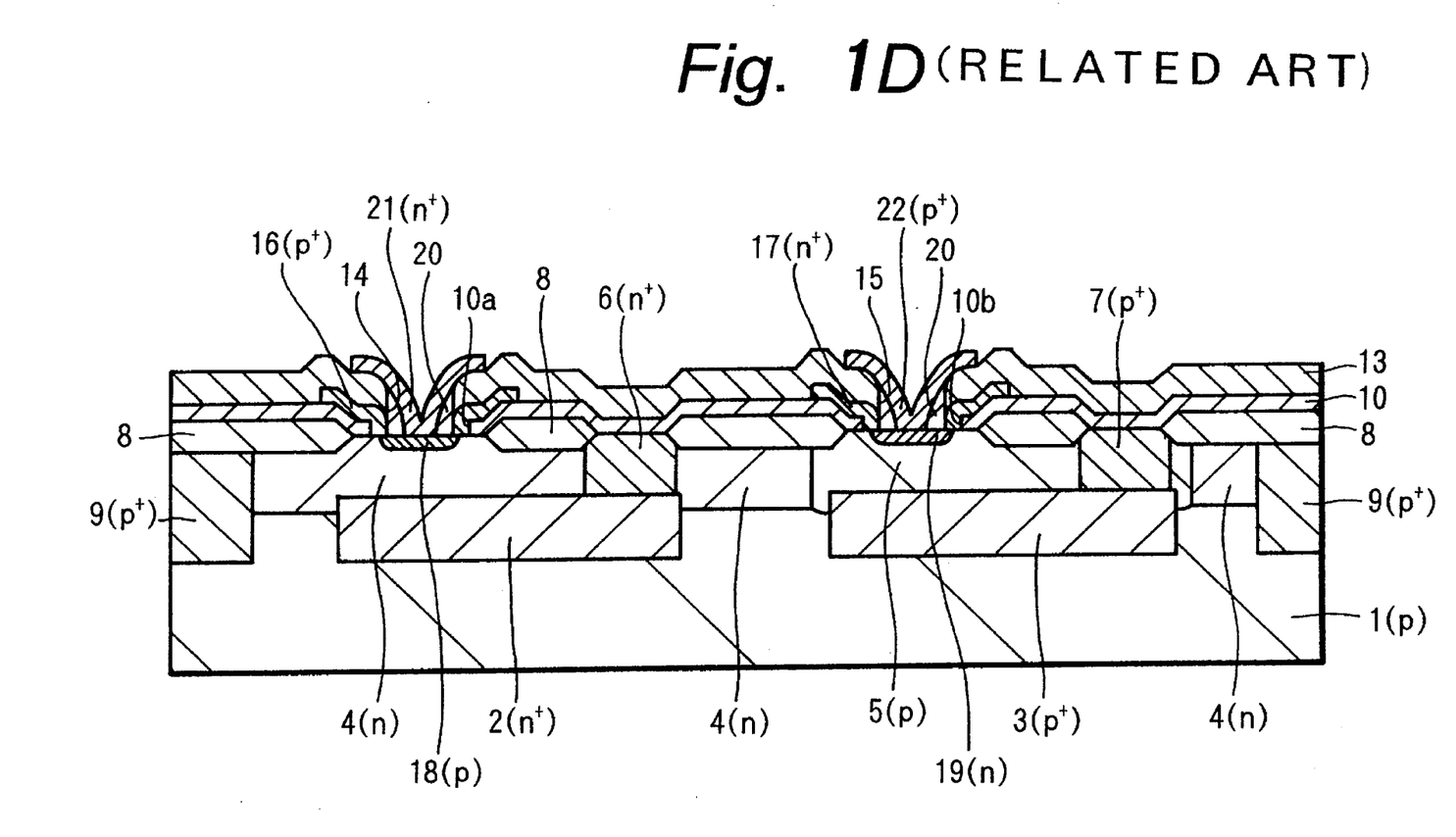

As shown in FIG. 1D, the insulation film 13 and the $p^+$-type polycrystalline Si film 11 are selectively removed by sequential etching to form a hole 14 at the site for the base and emitter layers of the npn transistor, and the insulation film 13 and the $n^+$-type polycrystalline Si film 12 are selectively removed by sequential etching to form a hole 15 at the site for the base and emitter layers of the pnp transistor. The $p^+$-type polycrystalline Si film 11 remaining after the hole 14 is made behaves as the base electrode 16, and the $n^+$-type polycrystalline Si film 12 remaining after the hole 15 is made behaves as the base electrode 17. After that, a thin insulation film (not shown) is formed to cover at least the n-type Si epitaxial layer 4 exposed through the hole 14 and the p-well 5 exposed through the hole 15. Via this insulation film, a p-type impurity is ion-implanted into the n-type Si epitaxial layer 4 through the hole 14 to form a p-type base layer 18, and an n-type impurity is ion-implanted into the 5 through the hole 15 to form an n-type base layer 19. Subsequently, after an insulation film is formed on the entire surface, it is etched back vertically of the substrate surface by anisotropic dry etching. As a result, side wall spacers 20 in the form of insulation films are made on side walls of the holes 14 and 15. The side wall spacers 20 behave to separate the base electrode 16 from the emitter electrode 21 referred to later and to separate the base electrode 17 from the emitter electrode 22 referred to later.

After another polycrystalline Si film is formed on the entire surface, an n-type impurity is introduced into a selective portion of the polycrystalline Si film including the site for the emitter electrode of the npn transistor, and a p-type impurity is introduced into a selective portion of the polycrystalline Si film including the site for the emitter electrode of the pnp transistor, by ion implantation, for example. The polycrystalline Si film is then processed by etching to form an $n^+$-type polycrystalline Si film behaving as the emitter electrode 21 of the npn transistor, and a $p^+$-type polycrystalline Si film behaving as the emitter electrode 22 of the pnp transistor.

Figure 1E:
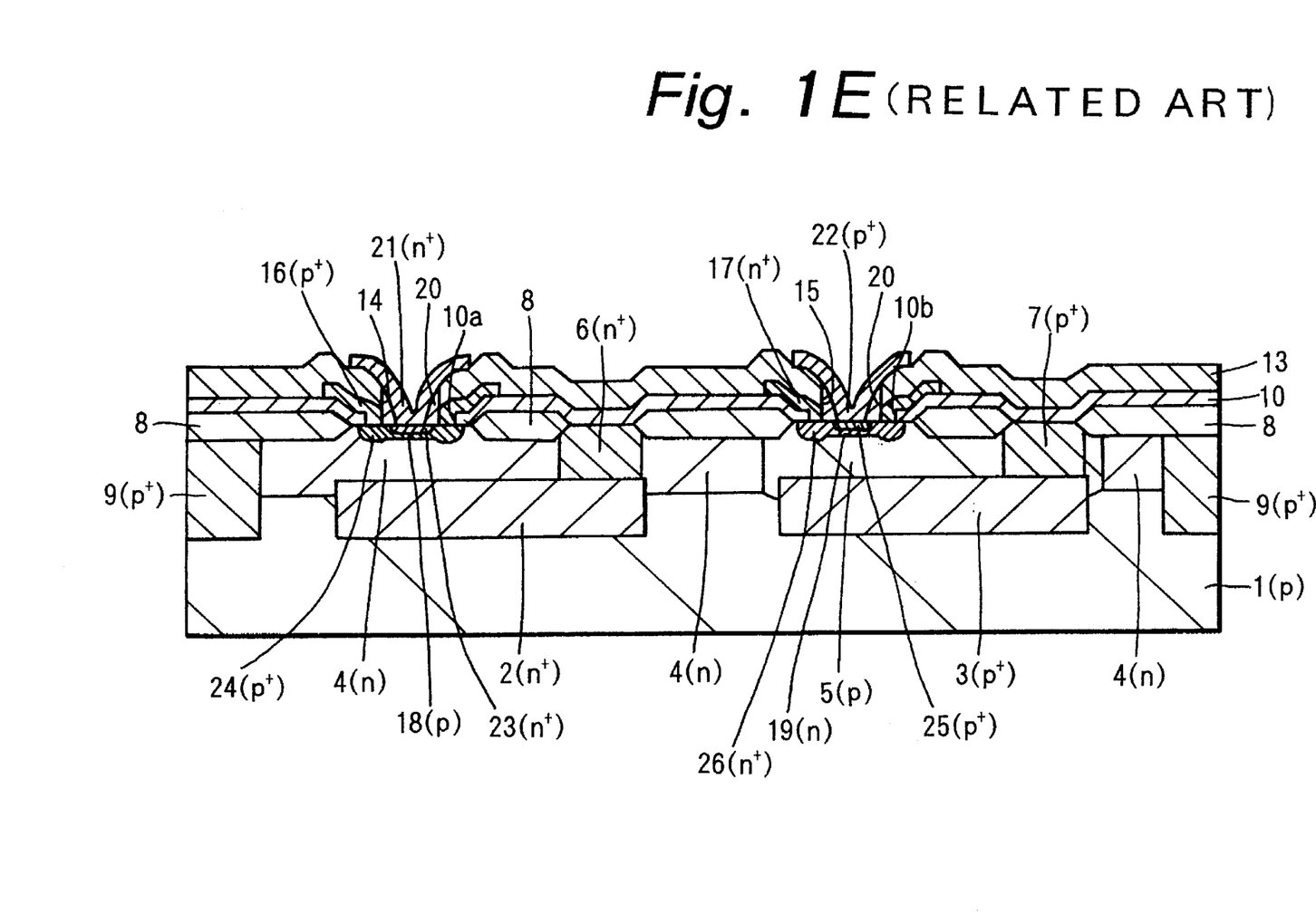

After that, the structure is annealed. As a result, as shown in FIG. 1E, the n-type impurity in the emitter electrode 21 comprising the $n^+$-type polycrystalline Si film diffuses into the p-type base region 18 to form an $n^+$-type emitter layer 23 and the p-type impurity in the base electrode 16 comprising the $p^+$-type polycrystalline Si film diffuses into the n-type Si epitaxial layer 4 to form a $p^+$-type base-contact layer 24 coupled to the p-type base layer 18. Similarly, the p-type impurity in the emitter electrode 22 comprising the $p^+$-type polycrystalline Si film diffuses into the n-type base layer 19 to form a $p^+$-type emitter layer 25, and the n-type impurity in the base electrode 17 comprising the $n^+$-type polycrystalline Si film diffuses into the p-well 5 to form an $n^+$-type base-contact layer 26 coupled to the n-type base layer 19.

In this case, the $n^+$-type emitter layer 23, p-type base layer 18, $p^+$-type base-contact layer 24, n-type Si epitaxial layer 4 behaving as the collector layer, base electrode 16, emitter electrode 21, and so forth, make up the npn transistor having a double-layered polycrystalline Si structure, whereas the $p^+$-type emitter layer 25, n-type base layer 19, $n^+$-type base-contact layer 26, p-well 5 behaving as the collector layer, base electrode 17, emitter electrode 22, and so forth, make up the pnp transistor having a double-layered polycrystalline Si structure.

After that, although not shown, through some steps of forming an inter-layer insulation film, making a contact hole in the inter-layer insulation film, making wiring of aluminum (Al), etc., an intended complementary bipolar transistor is completed.

It is desirable that the npn transistor and the pnp transistor match in characteristics with each other because the performance of a complementary bipolar transistor is determined by either its npn transistor or pnp transistor that is inferior in characteristics. In this respect, the conventional complementary bipolar transistor referred to above is advantageous because its npn transistor and pnp transistor have approximately symmetrical shapes.

However, since the conventional method for manufacturing the complementary bipolar transistor described above makes the emitter layer of the npn transistor and the emitter layer of the pnp transistor by the process comprising: making the polycrystalline Si film; ion-implanting an impurity into the polycrystalline Si film; and making the ion-implanted impurity to diffuse from the polycrystalline Si film used as the source of the impurity, it does not match well with the in-situ phosphorus doped poly Si emitter technique used in a process for fabricating high-performance npn transistors, which comprises doping phosphorus as an n-type impurity upon making a polycrystalline Si film by CVD and forming an emitter layer by using the p-doped $n^+$-type polycrystalline Si film as the source of the impurity. Therefore, the conventional method has its limit in increasing the impurity concentration $Q_e$ of the emitter layer, decreasing the emitter resistance $R_e$, and decreasing the annealing temperature, which disturbs improvements in performance of complementary bipolar transistors and compatibility of the method with a process for manufacturing sub-half-micron bipolar CMOSs.

OBJECT AND SUMMARY OF THE INVENTION

An object of the invention is to provide a method for fabricating a semiconductor device compatible with the technique configured to make emitter layers by using as an impurity-diffusive source a semiconductor film doped with impurities upon forming thereof.

According to an aspect of the invention, there is provided a method for fabricating a semiconductor device, comprising the steps of:

making a first insulation film on a semiconductor substrate;

making a first hole at a predetermined portion of the first insulation film;

making a first electrically conductive film on the first insulation film and on a portion of the semiconductor substrate exposed through the first hole;

patterning the first electrically conductive film into a predetermined configuration;

making a second insulation film to cover the first electrically conductive film;

making a second hole at a predetermined portion of the second insulation film and the first electrically conductive film;

making a third insulation film on a side wall of the second hole;

making a second electrically conductive film to cover the second hole;

making a fourth insulation film on the second electrically conductive film;

making a third hole at a predetermined portion of the second insulation film, the fourth insulation film and the first electrically conductive film;

making a fifth insulation film on a side wall of the third hole; and making a third electrically conductive film to cover the third hole.

The method for fabricating a semiconductor device according to the invention may include after the step of making the first electrically conductive film, a step of introducing an impurity of a first conduction type into a predetermined portion of the first electrically conductive film including the site for the second hole and a step of introducing an impurity of a second conduction type into a predetermined portion of the first electrically conductive film including the site for the third hole; the second electrically film being of the second conduction type, and the third electrically conductive film being of the first conduction type.

The method for fabricating a semiconductor device according to the invention may further include steps of:

introducing an impurity of the first conduction type into the semiconductor substrate through the second hole after making the second hole;

introducing an impurity of the second conduction type into the semiconductor substrate through the third hole after making the third hole; and annealing the structure to diffuse the impurity of the first conduction type in the first electrically conductive film, the impurity of the second conduction type in the first electrically conductive film, the impurity of the second conduction type in the second electrically conductive film and the impurity of the first conduction type in the third electrically conductive film into the semiconductor substrate.

Each of the first electrically conductive film, second electrically conductive film and third electrically conductive film used in the method for fabricating a semiconductor device according to the invention typically comprises a single crystal Si film, polycrystalline Si film or amorphous Si film; or alternatively, they may be multi-layered films comprising at least two different films chosen from the group consisting of a single crystal Si film, polycrystalline Si film and amorphous Si film. At least one of the second electrically conductive film and the third electrically conductive film is preferably a single crystal Si film, a polycrystalline Si film or an amorphous Si film doped with an impurity upon being formed, or may be a multi-layered film comprising at least two kinds of films chosen from the group consisting of a single crystal Si film, polycrystalline Si film and amorphous film doped with an impurity upon being formed.

According to the method for fabricating a semiconductor device according to the invention having the above-described features, since the second hole is made independently from the formation of the third hole, the third electrically conductive film in the third hole can be formed independently from the formation of the second electrically conductive film in the second hole. Therefore, if, for example, the second hole is made in the site for emitter layer of the npn transistor, and the third hole is made in the site for the emitter layer of the pnp transistor, then the emitter layer of the npn transistor can be made by diffusing the n-type impurity into the semiconductor substrate from the second electrically conductive film doped with the n-type impurity upon being formed and used as the source of the impurity, and the emitter layer of the pnp transistor can be made by diffusing the p-type impurity into the semiconductor substrate from the third electrically conductive film doped with the p-type impurity upon being formed and used as the source of the impurity. That is, the method according to the invention is compatible with the technique configured to make emitter layers by using, as their impurity sources, semiconductor films doped with impurities upon being formed. This makes it possible to fabricate complementary bipolar transistors with a higher performance, improves the compatibility with the process for manufacturing sub-half-micron bipolar CMOSs, and leads to realization of high-performance complementary bipolar LSIS and high-performance complementary bipolar CMOS LSIS.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

A first embodiment of the invention is described below in detail with reference to the drawings. In all drawings showing embodiments of the invention, identical or equivalent elements are labelled with the same reference numerals.

FIGS. 2A to 2F illustrate a method for fabricating a complementary bipolar transistor according to the first embodiment of the invention.

Figure 2A:
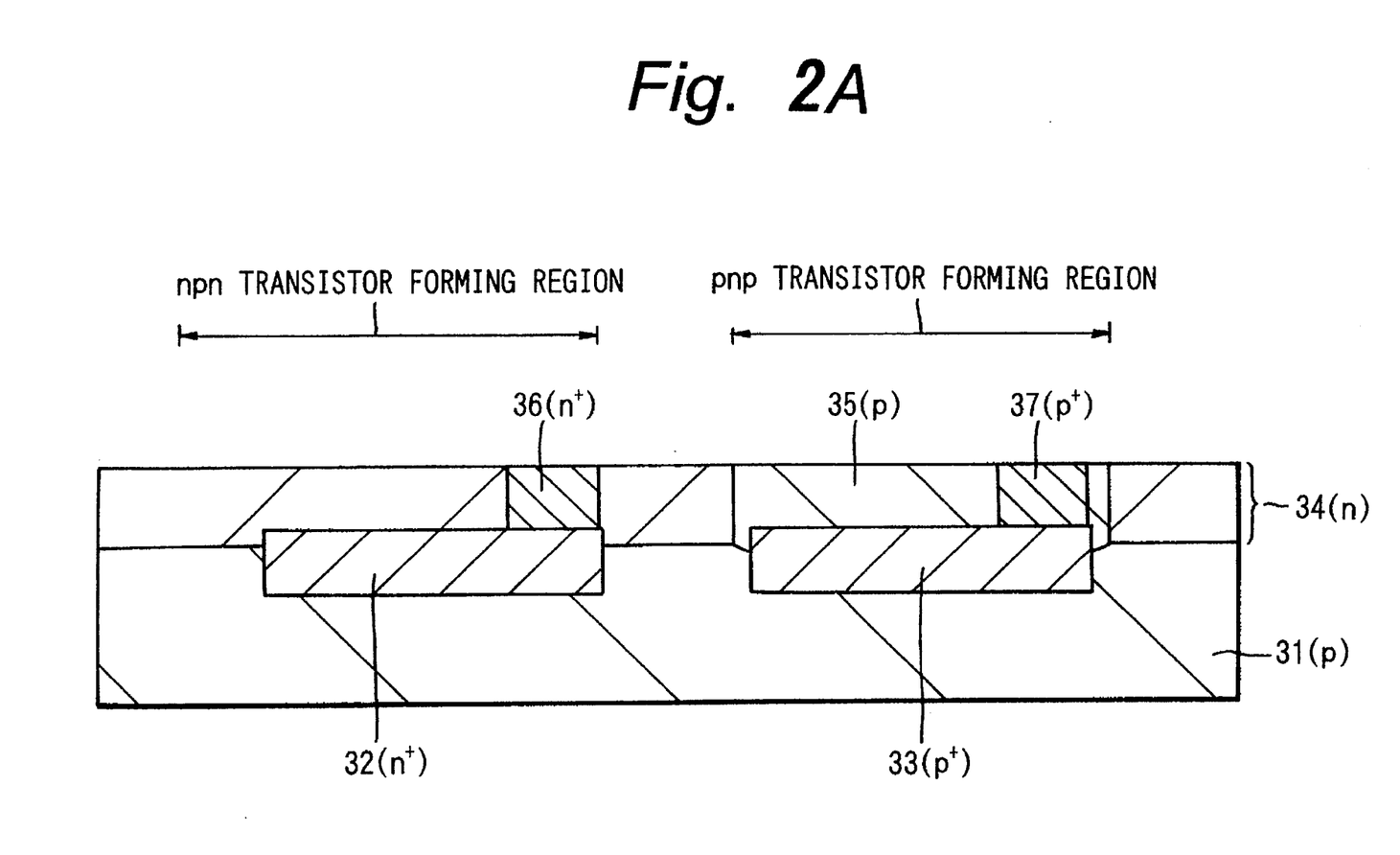
FIGS. 2A through 2F show a method for fabricating a complementary bipolar transistor, taken as a first embodiment of the invention, in which holes for its npn transistor's emitter and base and holes for its pnp transistor's emitter and base are made in different steps independent from each other.

As shown in FIG. 2A, the process starts with making an $n^+$-type buried layer 32 and a $p^+$-type buried layer 33 in a p-type Si substrate 31. These $n^+$-type buried layer 32 and $p^+$-type buried layer 33 are made, for example, by selectively diffusing an n-type impurity such as antimony (Sb) and a p-type impurity such as boron (B) into the p-type Si substrate 31. Next stacked on the p-type substrate 31 is an n-type Si epitaxial layer 34, 0.5 to 1.0 µm thick, for example. It is followed by selective ion implantation of a p-type impurity such as B into a portion of the n-type Si epitaxial layer 34 at the site for the pnp transistor to make a p-well 35. Then an n-type impurity such as phosphorus (P) or arsenic (As) is selectively ion-implanted into a portion of the n-type Si epitaxial layer 34 at the site for the npn transistor to make an $n^+$-type layer 36, and a p-type impurity such as B is selectively ion-implanted into a portion of the p-well 35 at the site for the pnp transistor to make a $p^+$-type layer 7.

Figure 2B:
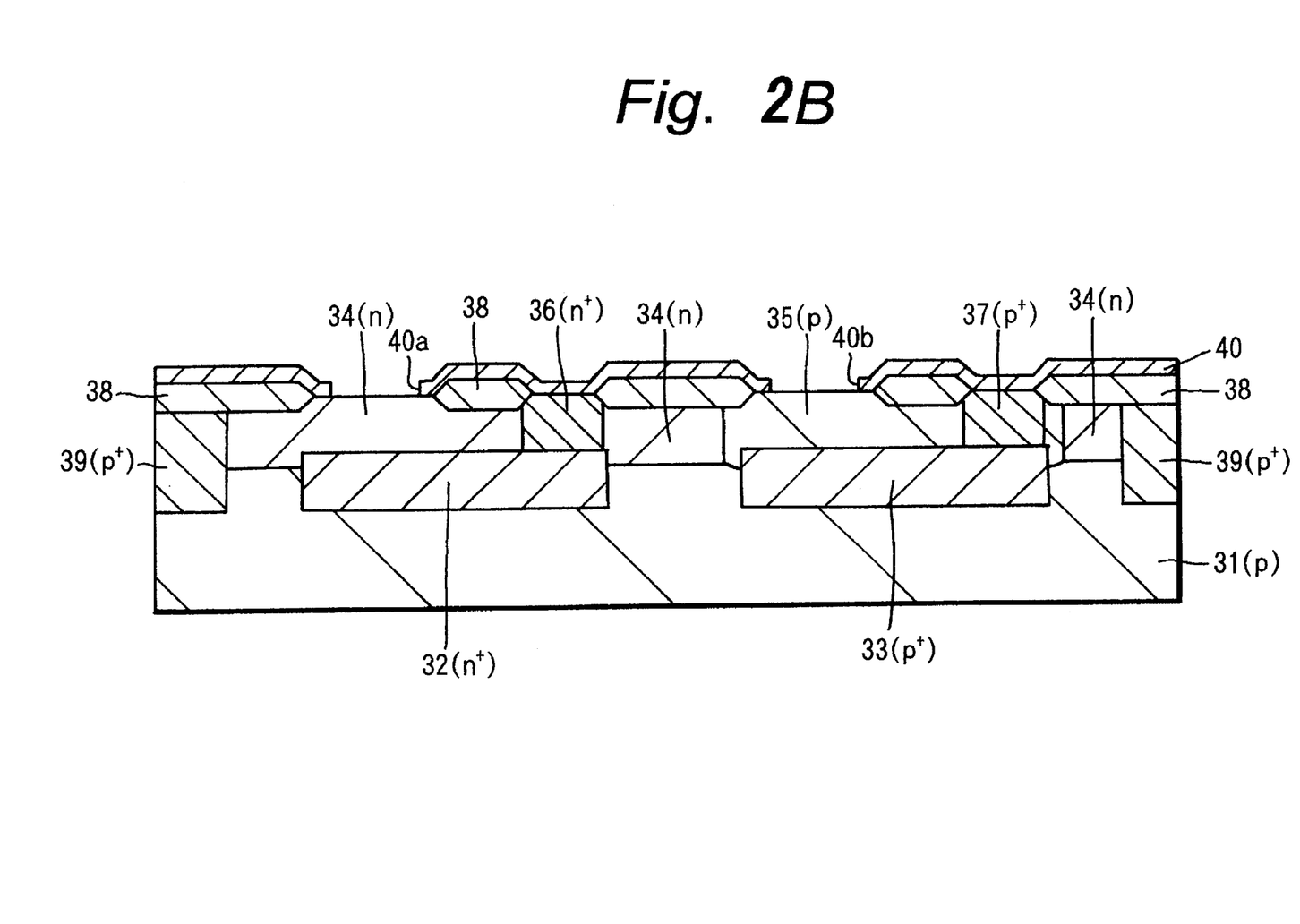

Next with reference to FIG. 2B, after selectively providing a field insulation film 38 comprising a $SiO_2$ film, e.g. 400 to 800 nm thick, on the n-type Si epitaxial layer 34 for isolation of devices by selective oxidation (LOCOS), for example, a $p^+$-type layer 39 for isolation of devices is made in the n-type Si epitaxial layer 34 immediately under the field insulation film 38. The $p^+$-type layer 39 may be made simultaneously with the p-well 35. Next, after an insulation film 40 such as $SiO_2$ film, e.g. about 100 nm thick, is made on the entire surface by CVD, for example, selective portions of the insulation film 40 corresponding to the sites for the npn transistor and the pnp transistor are removed to make holes 40a and 40b by dry etching such as reactive ion etching (RIE), for example.

Figure 2C:
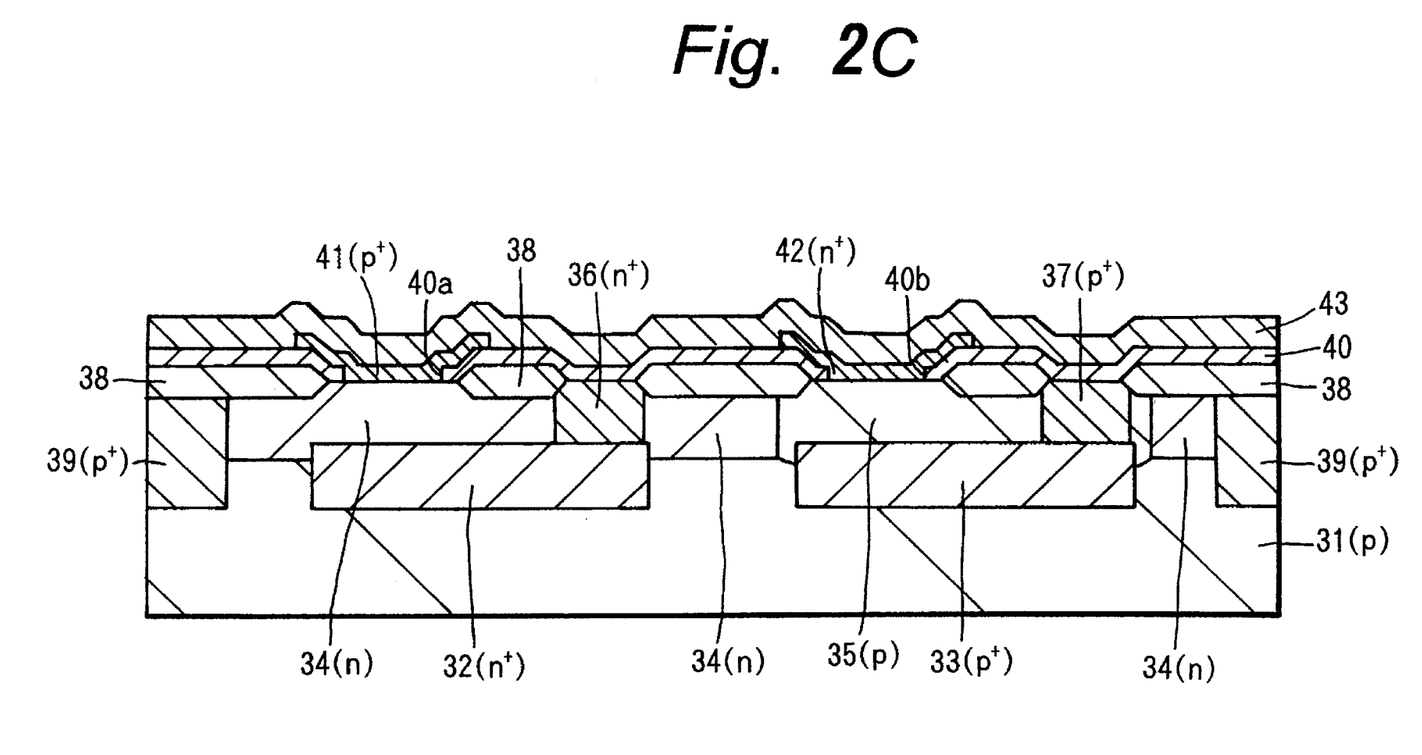

After another polycrystalline Si film, e.g. 100 to 200 nm thick, is again stacked on the entire surface by CVD, for example, a p-type impurity such as B is introduced into a predetermined portion of the polycrystalline Si film including the site for the base electrode of the npn transistor, and an n-type impurity such as P or As is introduced into a predetermined portion of the polycrystalline Si film including the site for the base electrode of the pnp transistor by using ion implantation, for example. The polycrystalline Si film is next processed by RIE or other dry etching to make, as shown in FIG. 2C, a $p^+$-type polycrystalline Si film 41 having the shape corresponding to the base electrode of the npn transistor and an $n^+$-type polycrystalline Si film 42 having the shape corresponding to the base electrode of the pnp transistor. After that, an insulation film 43 such as $SiO_2$ film, e.g. 200 to 400 nm thick, is stacked on the entire surface by CVD, for example.

Figure 2D:
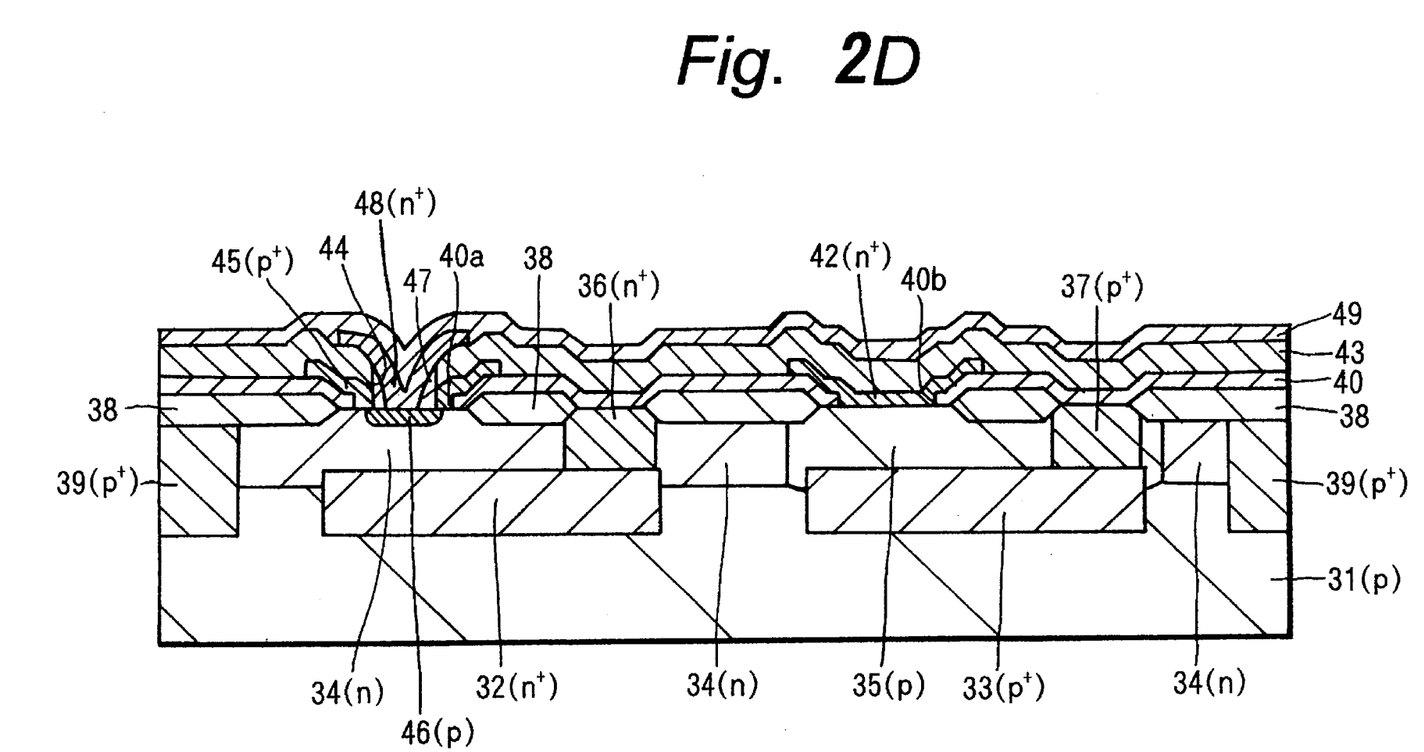

Next with reference to FIG. 2D, regions for the base layer and the emitter layer of the npn transistor in the insulation film 43 and in the $p^+$-type polycrystalline Si film 41 are removed sequentially by dry etching such as RIE to make a hole 44. The portion of the $p^+$-type Si film 41 remaining after the hole 44 is made behaves as the base electrode 45. Then the entire surface is covered by an insulation film (not shown), e.g. 10 to 20 nm thick, by CVD, for example, and a p-type impurity such as B is ion-implanted into the n-type Si epitaxial layer 34 through the hole 44 via the insulation film to make a p-type base region 46. The entire surface is again covered by an insulation film, e.g. 400 to 600 nm thick, by CVD, for example, and the insulation film is selectively etched back vertically to the substrate surface by anisotropic dry etching such as RIE. As a result, a side wall spacer 47 comprising the insulation film is formed on the side wall of the hole 44. The side wall spacer 47 serves to separate the base electrode 45 from the emitter electrode 48 referred to later. After the entire surface is again covered by an $n^+$-type polycrystalline Si film doped with P, for example, by CVD, for example, the $n^+$-type polycrystalline Si film is processed by dry etching such as RIE to form the emitter electrode 48 comprising the $n^+$-type polycrystalline Si film. After that, an insulation film 49 such as $SiO_2$, e.g. 100 to 200 nm thick, on the entire surface by CVD, for example.

Figure 2E:
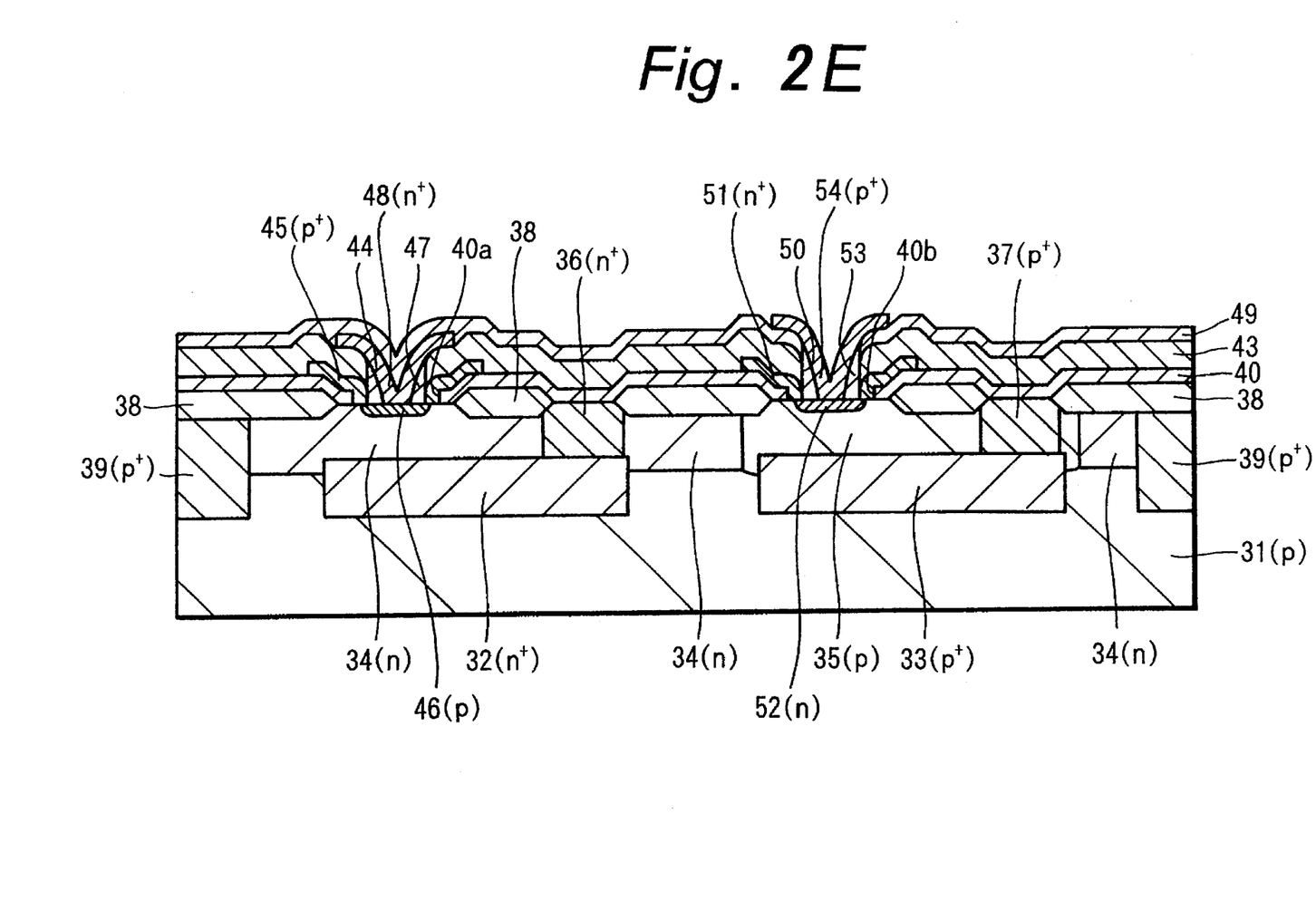

Next with reference to FIG. 2E, portions of the insulation film 49, the insulation film 43 and the $n^+$-type polycrystalline Si film 42 in the sites for the base and emitter regions of the pnp transistor are sequentially removed by dry etching such as RIE, for example, to make a hole 50. The portion of the $n^+$-type Si film 42 remaining after the hole 50 is made behaves as the base electrode 51. Then the entire surface is covered by an insulation film (not shown), e.g. 10 to 20 nm thick, by CVD, for example, and an n-type impurity such as P or As is ion-implanted into the p-well 35 via the insulation film through the hole 50 to make an n-type base layer 52. The entire surface is again covered by an insulation film, e.g. 400 to 600 nm thick, by CVD, for example, and the insulation film is selectively etched back vertically to the substrate surface by anisotropic dry etching such as RIE. As a result, a side wall spacer 53 comprising the insulation film is formed on the side wall of the hole 50. The side wall spacer 53 serves to separate the base electrode 51 from the emitter electrode 54 referred to later. After the entire surface is again covered by an $p^+$-type polycrystalline Si film doped with B, for example, by CVD, for example, the $p^+$-type polycrystalline Si film is processed by dry etching such as RIE to form the emitter electrode 54 comprising the $p^+$-type polycrystalline Si film.

During the dry etching for making the emitter electrode 54, the insulation film 49 formed on the emitter electrode 48 of the npn transistor behaves as a protective film and maintains the emitter electrode 48 non-etched. Since overetching is done upon making the side wall spacer 53 for separation between the emitter electrode 54 and the base electrode 51 of the pnp transistor, careful consideration is required in determining appropriate material and thickness of insulation film 49. When, for example, the insulation film 49 is $SiO_2$ and the side wall spacer 53 is SiN, the decrease in thickness of the insulation film 49 caused by overetching upon making the side wall spacer 53 can be prevented by executing RIE for making the side wall spacer 53 under a condition with a high etching selectivity of SiN relative to $SiO_2$.

Figure 2F:
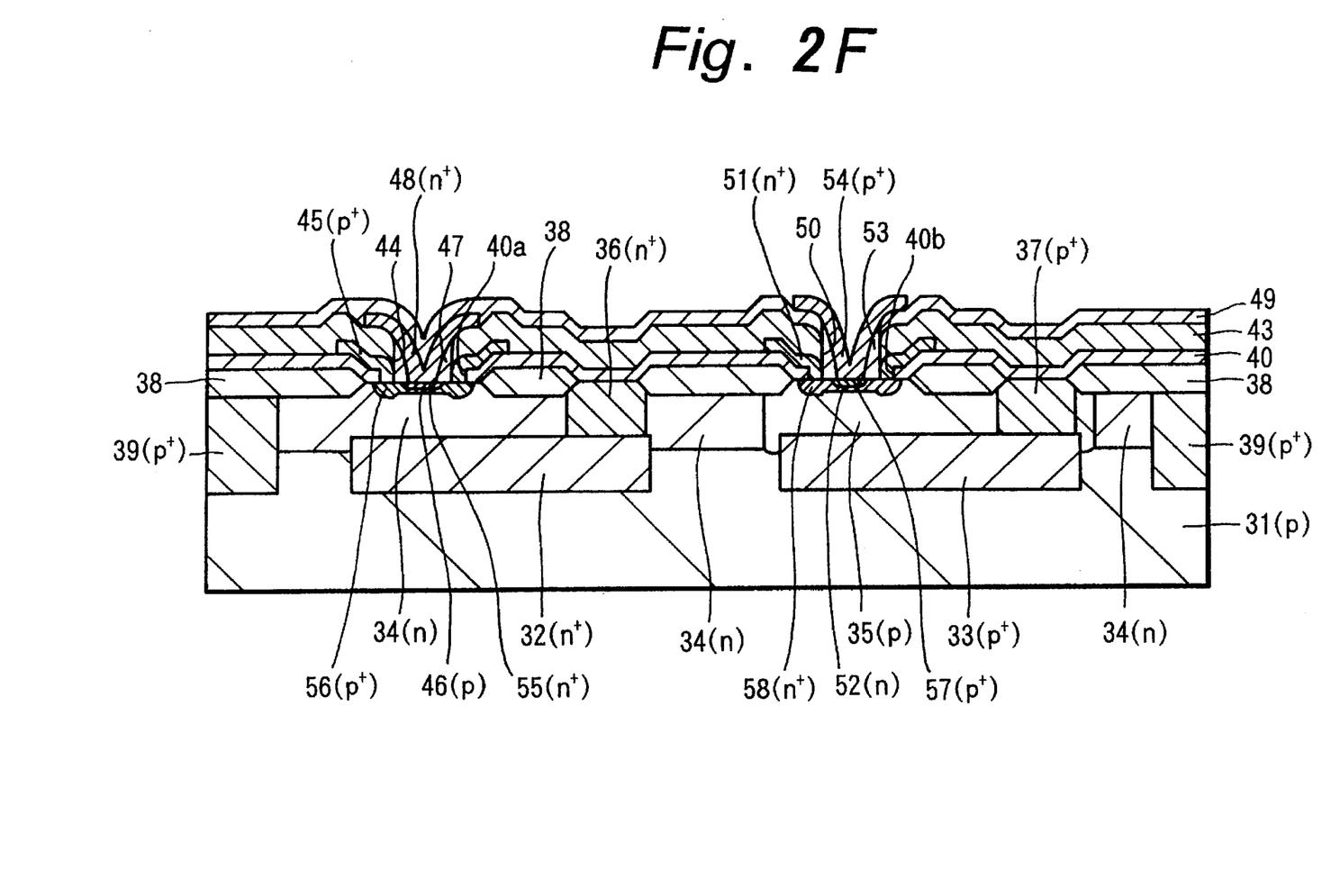

Next with reference to FIG. 2F, the structure is annealed. Thus the n-type impurity such as P or As in the emitter electrode 48 comprising the $n^+$-type polycrystalline Si film diffuses into the p-type base layer 46 to make an $n^+$-type emitter layer 55, and the p-type impurity such as B in the base electrode 45 comprising the $p^+$-type polycrystalline Si film diffuses into the n-type Si epitaxial layer 34 to make a $p^+$-type base contact layer 56 coupled to the p-type base layer 46. Also, the p-type impurity such as B in the emitter electrode 54 comprising the $p^+$-type polycrystalline Si film diffuses into the n-type base layer 52 to make a $p^+$-type emitter layer 57, and the n-type impurity such as P or As in the base electrode 51 comprising the $n^+$-type polycrystalline Si film diffuses into p-well 35 to make an $n^+$-type base contact layer 58 coupled to the n-type base layer 52.

In this case, as shown in FIG. 2F, the $n^+$-type emitter layer 55, p-type base layer 46, $p^+$-type base contact layer 56, collector layer comprising the n-type Si epitaxial layer 34, base electrode 45, emitter electrode 48, and so on, make up the npn transistor having a double-layered polycrystalline Si structure, whereas $^+$-type emitter layer 57, n-type base layer 52, $n^+$-type base contact layer 58, collector layer comprising the p-well 35, base electrode 51, emitter electrode 54, and so on, make up the pnp transistor having a double-layered polycrystalline Si structure.

After that, although not shown, through some steps of making an inter-layer insulation film, making a contact hole extending through the inter-layer insulation film, providing wiring of Al or other material, and so forth, an intended complementary bipolar transistor is completed.

According to the first embodiment, by making the hole 44 for access to the site for the emitter layer of the npn transistor in the step independent from the step for making the hole 50 for access to the site for the emitter layer of the pnp transistor, the $n^+$-type polycrystalline Si film behaving as the source of the impurity for making the emitter layer of the npn transistor and as its emitter electrode can be made in the step independent from the step for making the $p^+$-type polycrystalline Si film behaving as the source of the impurity for making the emitter layer of the pnp transistor and as its emitter electrode. Therefore, this embodiment matches well with the technique which is configured to dope an impurity upon making a polycrystalline Si film by CVD and uses the impurity-doped polycrystalline Si film as the source of the impurity to make an emitter layer, and employs this technique in the process for fabricating the complementary bipolar transistor without inviting any adverse effect. This results in providing complementary bipolar transistors with a higher performance, decreasing the annealing temperature, and improving the compatibility with the process for fabricating sub-half-micron bipolar CMOSs, and further leads to realization of high-performance complementary bipolar LSIs and high-performance complementary bipolar CMOSLSIs.

Explained below is a second embodiment of the invention.

In the second embodiment, the annealing process for forming the $n^+$-type emitter layer 55, $p^+$-type base contact layer 56, $p^+$-type emitter layer 57 and $n^+$-type base contact layer 58 may comprise two different steps with different conditions, that is, a low-temperature annealing process at 600° to 700° C. for 1 to 10 hours and a high-temperature annealing process at 900° to 1000° C. for seconds to hours, so as to improve the transistor characteristics, such as decrease in emitter resistance and improvement in $h_{FE}$.

Figure 3:
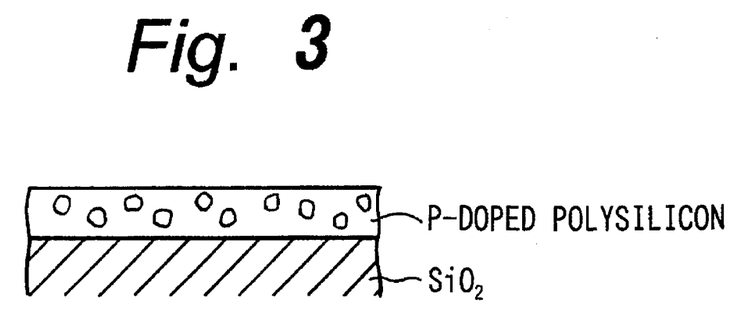
FIG. 3 is a schematic diagram of a polycrystalline silicon film with an enlarged grain size, taken as a second embodiment of the invention.

More specifically, the low-temperature annealing process as the first step promotes enlargement of the grain size of the polycrystalline silicon film, reduces the grain boundary of the polycrystalline silicon, and results in promoting the activation of the emitter impurity. This aspect is schematically shown in FIG. 3 where the CVD conditions of the polycrystalline Si film are 550° C. (deposition temperature), 2 Torr (pressure), 1.3 wt. % (phosphorus content) and 150 nm (thickness).

In the high-temperature annealing process executed after enlargement of the grain size of the polycrystalline silicon film, diffusion of the impurity proceeds at a moderate speed as compared with a high diffusion speed in polycrystalline silicon with non-reduced grain boundary, and hence makes a shallow function of the emitter.

Figure 4:
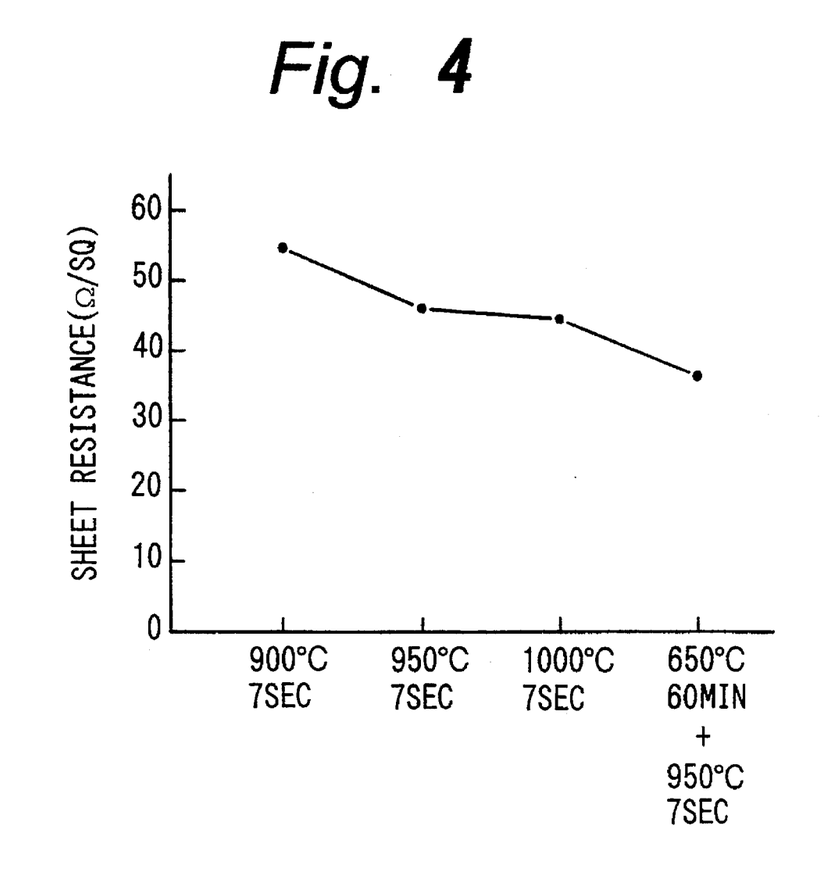
FIG. 4 is a diagram showing the relation between fabricating conditions and resistance of the polycrystalline Si film with an enlarged grain size shown in FIG. 3.

FIG. 4 shows the dependency of the sheet resistance of in-situ phosphorus doped amorphous Si upon annealing.

As shown in FIG. 3, crystal grains with enlarged grain size are formed in the polycrystalline Si film or a $SiO_2$ film.

As shown in FIG. 4, when the annealing process comprises, for example, two annealing steps at low and high temperatures, for example at 650° C. for 60 minutes and at 950° C. for 7 seconds, the sheet resistance of polycrystalline Si is reduced to 38 Ω/square as compared with 55 Ω/square at 900° C. for 7 seconds. This shows that electric characteristics of bipolar transistors can be improved by minimizing the emitter resistance.

Shown below is a third embodiment of the invention.

According to the third embodiment, the first embodiment is modified such that, after the polycrystalline Si film used for making the $n^+$-type polycrystalline Si film 42 and the $p^+$-type polycrystalline Si film 41 is formed, the grain size of the polycrystalline Si film is enlarged to reduce the base resistances of the npn transistor and pnp transistor. Enlargement of the grain size can be attained by first ion-implanting Si into the polycrystalline Si film and then annealing it to invite solid phase growth, or alternatively, by first making an amorphous Si film by CVD and then annealing it to invite solid phase growth.

Figure 5:
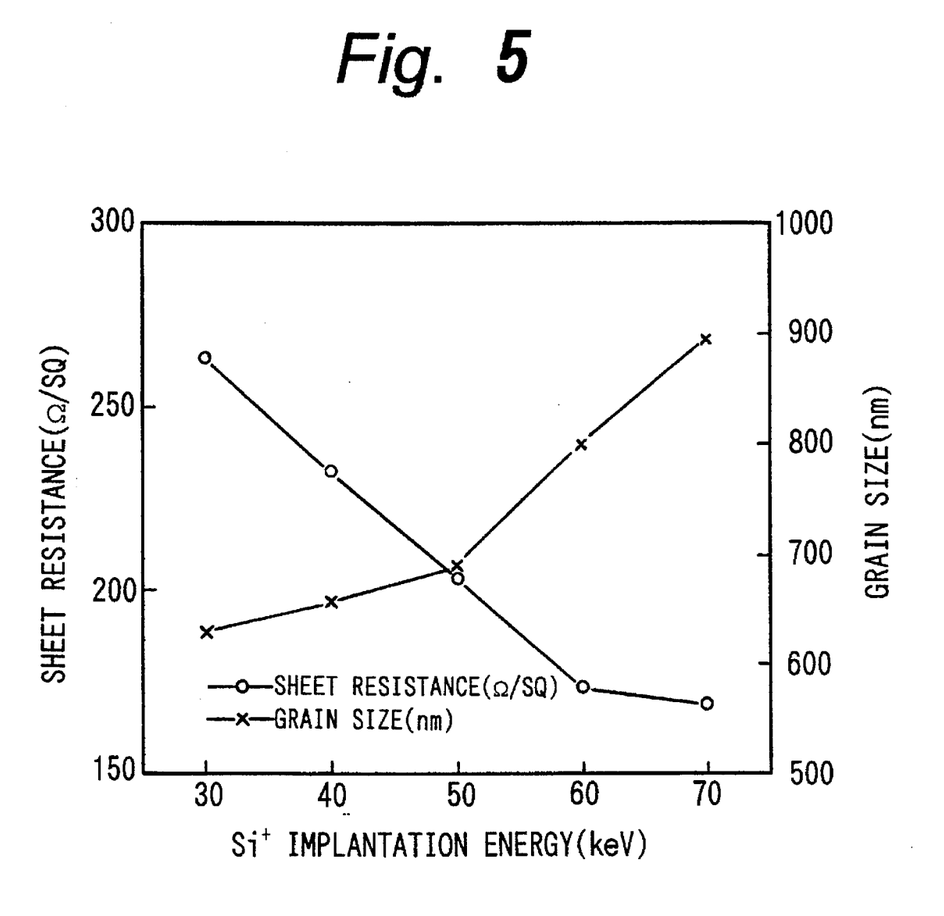
FIG. 5 is a diagram showing a process for fabricating a polycrystalline Si film with an enlarged grain size, taken as a third embodiment of the invention.

For example, after a polycrystalline Si film, 100 to 200 nm thick, is formed by CVD, Si is ion-implanted with the energy of 50 to 100 keV approximately to cause amorphization. After that, by annealing the structure at 500° to 700° C. for one to tens of hours, the grain size is enlarged from tens to hundreds of nanometer to the order of μm. FIG. 5 shows changes in grain size and sheet resistance of the polycrystalline Si depending upon the $S^+$ implantation energy where the polycrystalline Si film made by depositing a 150 nm thick polycrystalline Si film by CVD, then ion-implanting Si of 30 to 70 keV and $2\times10^{15}$ $cm^{-2}$ and boron of 15 keV and $5\times10^{15}$ $cm^{-2}$, then enlarging the grain size by solid phase growth at 600° C. for three hours, and activating it by RTA (Rapid Thermal Annealing) of 1000° C. and 5 seconds. When the polycrystalline Si film is 150 nm thick, it is changed to an amorphous structure by ion implantation with the $Si^+$ implantation energy of 60 to 70 keV, and the grain size is enlarged by subsequent annealing to reduce the sheet resistance.

By using this process, the sheet resistance of polycrystalline Si film can be reduced to substantially a half the conventional one, and the base resistance can be reduced accordingly. By additionally optimizing conditions of RTA, the sheet resistance of polycrystalline Si can be reduced to approximately a quarter the conventional one, and the base resistance can be reduced to approximately one third.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

As described above, since the invention is configured to make the second hole in the step independent from the step of making the third hole, it matches well with the technique which uses the semiconductor films doped with impurities upon being made as sources of impurities for making emitters. It is therefore possible to fabricate complementary bipolar transistors with a high performance.

What is claimed is:

1. A method for making a semiconductor device, comprising the steps of:

preparing a semiconductor substrate including a first semiconductor region of a first conductivity type and a second semiconductor region of a second conductivity type;

forming a first insulating layer on the semiconductor substrate;

selectively removing portions of the first insulating layer down to the first semiconductor region and down to the second semiconductor region to provide first and second contact holes therein;

depositing a first polysilicon layer over the first insulating layer to fill the first and second contact holes therewith;

subjecting a first portion of the first polysilicon layer including the first contact hole to ion implantation to provide a conductivity of a second conductivity type to the first portion of the first polysilicon layer and subjecting a second portion of the first polysilicon layer including the second contact hole to ion implantation to provide a conductivity of the first conductivity type to the second portion of the first polysilicon layer;

selectively removing remaining portions of the first polysilicon layer other than said first and second regions to define first and second shaped electrode layers of the second conductivity type and the first conductivity type, respectively;

forming a second insulating layer on the semiconductor substrate;

selectively removing a portion of the second insulating layer and said first electrode layer down to the first semiconductor region to define a third contact hole therein;

forming a third insulating layer on the substrate;

implanting impurities of the second conductivity type into the first semiconductor region through the third contact hole to make a base region having a second conductivity type;

forming a fourth insulating layer on the substrate;

selectively removing the fourth insulating layer such that a sidewall is formed in the third contact hole;

depositing a doped polysilicon film of the first conductivity type on the substrate to fill the third contact hole;

selectively removing a portion of the doped polysilicon film to define an emitter electrode of the first conductivity type in the third contact hole;

forming a fifth insulating film on the substrate;

selectively removing portions of the fifth insulating film, the second electrode layer and the first insulating layer down to the second semiconductor region to provide a fourth contact hole therein;

forming a sixth layer on the substrate;

implanting impurities of the first conductivity type into the second semiconductor region through the fourth contact hole to make a base region having a first conductivity type;

forming a seventh layer on the substrate;

selectively removing the seventh insulating layer such that a sidewall is formed in the fourth contact hole;

depositing a second doped polysilicon film of the second conductivity type on the substrate to fill the fourth contact hole;

selectively removing a portion of the second doped polysilicon film to define an emitter electrode of the second conductivity type in the fourth contact hole; and thereafter, annealing the substrate to provide a complementary bipolar transistor thereon.

2. A method as defined in claim 1, wherein the substrate is a $p^+$-type Si substrate, the first semiconductor region of a first conductivity type is an $n^+$-type buried layer and the second semiconductor region of a second conductivity type is a $p^+$-type buried layer.

3. A method as defined in claim 1, wherein in the subjecting step, $Si^+$ implantation is performed as well as ion implantation of impurities in forming the first and second portions of the first polysilicon layer.

4. A method as defined in claim 3, wherein $Si^+$ implantation is performed at 30 to 70 kev and $2 \times 10^{15}$ $cm^{-2}$.

5. A method as defined in claim 1, wherein said annealing step includes the steps of annealing the substrate at temperatures of from about 600° to 700° C. for a period of from about 1 to about 10 hours, and thereafter, annealing the substrate for a time of from seconds to hours at temperatures of from about 900° to about 1000° C.

* * * * *